United States Patent [19]
Magome et al.

[11] Patent Number: 5,805,866
[45] Date of Patent: Sep. 8, 1998

[54] ALIGNMENT METHOD

[75] Inventors: Nobutaka Magome; Shinji Mizutani, both of Kawasaki, Japan

[73] Assignee: Nikon Corporation, Japan

[21] Appl. No.: 826,064

[22] Filed: Mar. 24, 1997

Related U.S. Application Data

[63] Continuation of Ser. No. 385,420, Feb. 8, 1995, abandoned.

[30] Foreign Application Priority Data

Feb. 10, 1994 [JP] Japan .................................. 6-016115
Feb. 10, 1994 [JP] Japan .................................. 6-016116

[51] Int. Cl.$^6$ ............................................. G06F 9/455
[52] U.S. Cl. ................................. 395/500; 355/53
[58] Field of Search ..................... 364/578, 489, 364/490, 491, 559; 355/53; 356/375, 401; 395/500

[56] References Cited

U.S. PATENT DOCUMENTS

| | | | |
|---|---|---|---|
| 4,780,617 | 10/1988 | Umatate et al. | 364/491 |
| 4,833,621 | 5/1989 | Umatate | 364/491 |
| 4,918,320 | 4/1990 | Hamasaki et al. | 250/548 |
| 5,243,545 | 9/1993 | Ormond | 364/571.01 |
| 5,365,051 | 11/1994 | Suzuki et al. | 250/201 |
| 5,448,333 | 9/1995 | Iwamota et al. | 355/53 |
| 5,461,237 | 10/1995 | Wakamoto et al. | 250/548 |
| 5,498,501 | 3/1996 | Shimoda et al. | 430/22 |
| 5,502,311 | 3/1996 | Imai et al. | 250/548 |
| 5,561,606 | 10/1996 | Ota et al. | 364/489 |

OTHER PUBLICATIONS

U.S. Patent Application Serial No. 08/011,697 filed on Feb. 1, 1993 by Ota et al.

*Primary Examiner*—Kevin J. Teska
*Assistant Examiner*—Matthew Loppnow
*Attorney, Agent, or Firm*—Pennie & Edmonds LLP

[57] ABSTRACT

An alignment method for achieving accurate alignment by accurately eliminating an isolated area with a large nonlinear component of an alignment error from sample areas. A conversion parameter is calculated by statistical processing on the basis of a result obtained by measuring the position of each sample area on a substrate to be processed in advance, and each area on the substrate is aligned on the basis of arrangement coordinate values calculated using the conversion parameter. This method relates to a method of aligning each of a plurality of areas to be processed arranged on the substrate on the basis of arrangement coordinates on a first coordinate system (x, y) set on the substrate to a predetermined process position in a second coordinate system (X, Y) for defining the moving position of the substrate.

34 Claims, 11 Drawing Sheets

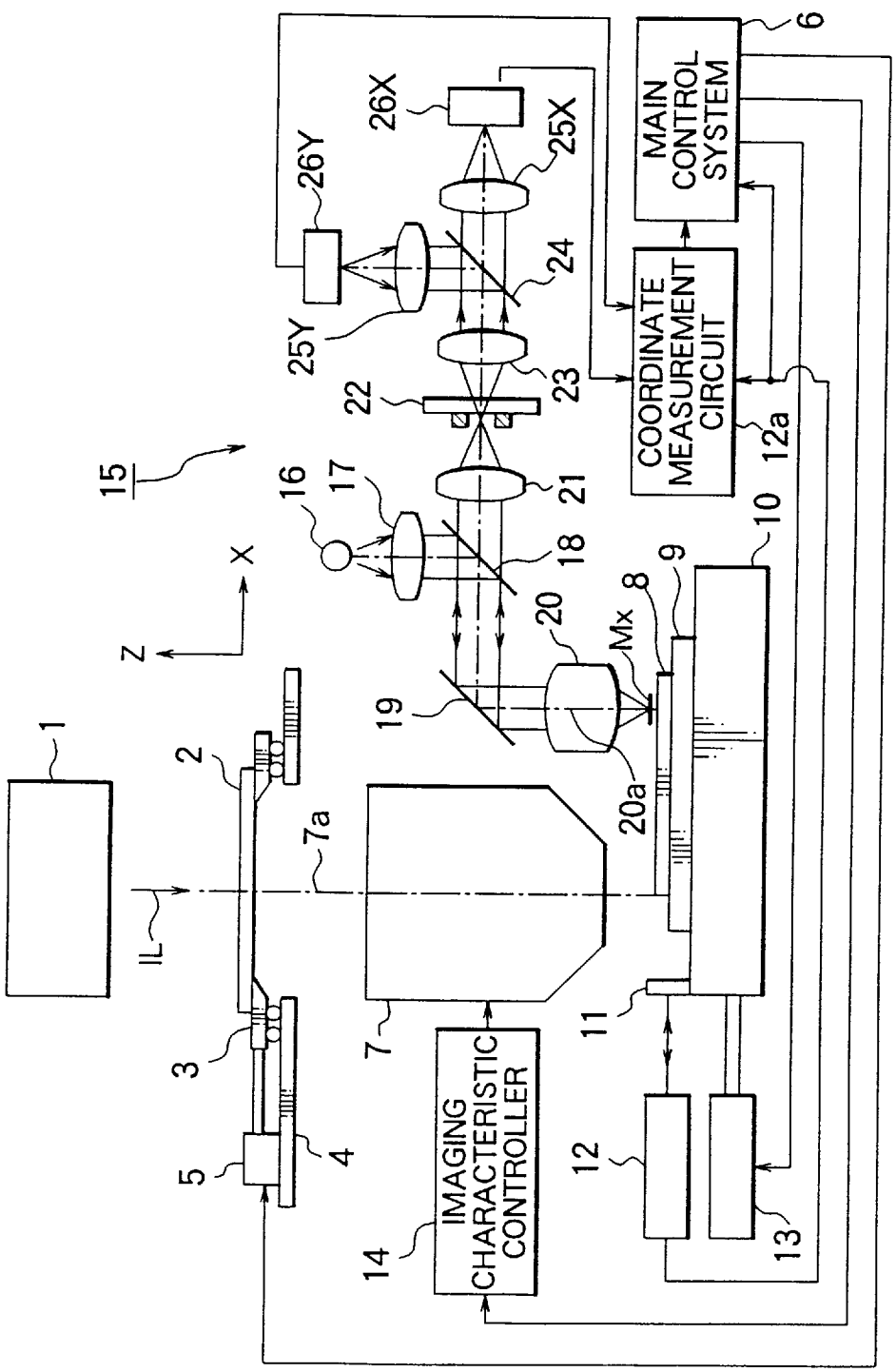

ALIGNMENT METHOD

This is a continuation of application Ser. No. 08/385,420, filed Feb. 8, 1995, now abandoned.

BACKGROUND OF THE INVENTION

1. Field of the Invention

The present invention relates to an alignment method for an exposure apparatus for sequentially exposing a pattern on a reticle onto, e.g., shot areas on a wafer and, more particularly, to an alignment method which is suitably applied to a case wherein each shot area on a wafer is sequentially aligned to the exposure position on the basis of arrangement coordinate values calculated based on statistical processing.

2. Related Background Art

Upon manufacture of semiconductor elements, liquid crystal display elements, and the like by a photolithography process, a projection exposure apparatus, which projects a pattern image on a photomask or a reticle (a term "reticle" will be used hereinafter as an example) onto each of shot areas on a wafer, coated with a photosensitive material, via a projection optical system, is used. In recent years, as a projection exposure apparatus of this type, a so-called step-and-repeat type exposure apparatus, and more particularly, a reduction projection type exposure apparatus (stepper) are popularly used. In such an apparatus, a wafer is placed on a stage which is two-dimensionally movable, and an operation for sequentially exposing a pattern image on a reticle onto shot areas on a wafer is repeated by stepping the wafer using the stage.

For example, since a semiconductor element is formed by repetitively exposing a large number of layers of circuit patterns on a wafer, alignment between a pattern image on a reticle and each shot area on which a circuit pattern has already been formed, i.e., alignment between the wafer and the reticle must be accurately performed when the second and subsequent circuit patterns are to be projected and exposed onto the wafer. The alignment of the wafer in the conventional stepper or the like is achieved by a method called enhanced global alignment (to be abbreviated as "EGA" hereinafter) (for example, see Japanese Patent Laid-Open No. 61-44429).

SUMMARY OF THE INVENTION

It is an object of the present invention to achieve accurate alignment by accurately eliminating an isolated shot with a large nonlinear component of an alignment error from sample shots in an alignment method wherein a conversion parameter is calculated by statistical processing on the basis of a result obtained by measuring the position of each sample shot on a wafer to be processed in advance, and each shot area on a wafer is aligned on the basis of arrangement coordinate values calculated using the conversion parameter.

An alignment method according to the present invention relates to a method of aligning each of a plurality of areas to be processed arranged on a substrate on the basis of arrangement coordinates on a first coordinate system (x, y) set on the substrate to a predetermined process position in a second coordinate system (X, Y) for defining the moving position of the substrate.

The method of the present invention comprises: the first step of measuring coordinate positions, on the second coordinate system (X, Y), of N (N is an integer not less than 2) sample areas selected in advance from a plurality of areas to be processed; the second step of calculating nonlinear components of deviation amounts of the coordinate positions of N sample areas from corresponding design positions on the basis of the coordinate positions measured in the first step, and calculating a variation E(N) of the N nonlinear components; and the third step of calculating nonlinear components of deviation amounts of the coordinate positions of (N−1) sample areas, obtained by excluding a predetermined sample area from the N sample areas, on the basis of the coordinate positions measured in the first step, and calculating a variation E(N−1, h) of these (N−1) nonlinear components.

Furthermore, the method of the present invention comprises: the fourth step of selecting the (N−1) sample areas used in the third step as sample areas for calculation when the variation E(N−1, h) of the nonlinear components calculated in the third step is smaller than the variation E(N) of the nonlinear components calculated in the second step, or selecting the N sample areas as sample areas for calculation when the variation E(N−1, h) of the nonlinear components calculated in the third step is not less than the variation E(N) calculated in the second step; and the fifth step of calculating the arrangement coordinate values, on the second coordinate system (X, Y), of the plurality of areas to be processed on the substrate by executing statistical processing of the coordinate positions, measured in the first step, of the sample areas for calculation selected in the fourth step.

In this case, if it is determined in the fourth step that the variation E(N−1, h) of the nonlinear components calculated in the third step is smaller than the variation E(N) of the nonlinear components calculated in the second step, it is preferable to repeat the second to fourth steps after replacing the N sample areas in the second step by the (N−1) sample areas used in the third step.

In the third step, it is preferable to calculate the nonlinear components of the deviation amounts, from corresponding design positions, of the coordinate positions of N sets of (N−1) sample areas, obtained by sequentially excluding an i-th (i is an integer from 1 to N) sample area from the N sample areas, on the basis of the coordinate positions measured in the first step, calculate variations of the N sets of (N−1) nonlinear components, and obtain a minimum one of the variations of the N sets of (N−1) nonlinear components.

Furthermore, the method of the present invention comprises: the step of repeating the second and third steps while sequentially excluding a predetermined sample area from the sample areas until the variation of the (N−1) nonlinear components calculated in the third step coincides with a predetermined expected value $E_0$ within a predetermined tolerance range $\epsilon$; and the step of calculating the coordinate positions, on the second coordinate system (X, Y), of the plurality of areas to be processed on the substrate by executing statistical processing of the coordinate positions, measured in the first step, of the sample areas which are left in the former step.

In this case, an example of the predetermined expected value $E_0$ is determined on the basis of a variation of measurement values of the coordinate positions, on the second coordinate system (X, Y), of these sample areas.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4 is a schematic view showing the arrangement of a projection exposure apparatus to which an exposure method of the present invention is applied;

DETAILED DESCRIPTION OF THE PREFERRED EMBODIMENTS

Figure 1A:
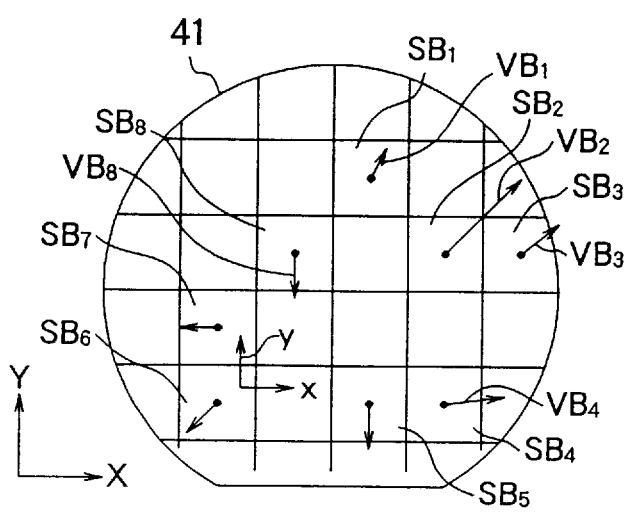
FIG. 1A is a view exaggeratingly showing an example of vectors $VB_1$ to $VB_8$ of alignment errors of sample shots $SB_1$ to $SB_8$ distributed on a wafer 41 to be exposed.

On a wafer, a plurality of shot areas (chip patterns) with alignment marks called wafer marks are formed, and these shot areas are regularly arranged on the basis of arrangement coordinate values set in advance on the wafer. However, the wafer cannot always be accurately aligned due to the following factors even when the wafer is stepped on the basis of the design arrangement coordinate values (shot arrangement) of the plurality of shot areas on the wafer:

(1) residual rotation error θ of wafer;

(2) orthogonality error w of stage coordinate system (or shot arrangement);

(3) linear expansion/contraction (scaling) parameters Rx and Ry of wafer; and (4) offset (translation) parameters Ox and Oy of wafer (central position).

In this case, coordinate conversion of the wafer based on these four error amounts (six parameters) can be described by a first-order conversion equation. Thus, a first-order conversion model for converting a coordinate system (x, y) on a wafer on which a plurality of shot areas with wafer marks are regularly arranged into a coordinate system (X, Y) on a stage as a still coordinate system can be expressed as follows using six conversion parameters a to f:

$$\begin{bmatrix} X \\ Y \end{bmatrix} = \begin{bmatrix} a & b \\ c & d \end{bmatrix} \begin{bmatrix} x \\ y \end{bmatrix} + \begin{bmatrix} e \\ f \end{bmatrix} \quad (1)$$

The six conversion parameters a to f in this conversion equation can be obtained by the EGA method as follows. First, some shot areas are selected from shot areas (chip patterns) as a plurality of objects to be exposed on a wafer. Design coordinate values, on a coordinate system (x, y), of the selected shot areas (to be referred to as "sample shots" hereinafter) are respectively represented by $(x_1, y_1)$, $(x_2, y_2), \ldots, (x_n, y_n)$, and the wafer marks on these sample shots are aligned to predetermined reference or fiducial positions. Actual coordinate values $(XM_1, YM_1)$, $(XM_2, YM_2), \ldots, (XM_n, YM_n)$ of the sample shots on a coordinate system (X, Y) on a stage at that time are measured.

The difference (Δx, Δy) between a computational arrangement coordinate value $(X_i, Y_i)$ (i=1, ..., n) obtained by substituting the design arrangement coordinate value $(x_i, y_i)$ of each of the selected wafer marks in the above-mentioned first-order conversion model, and a coordinate value $(XM_i, YM_i)$ measured upon alignment is considered as an alignment error. One alignment error component Δx is expressed by, e.g., a sum of $(X_i - XM_i)^2$ in association with i, and the other alignment error component Δy is expressed by, e.g., a sum of $(Y_i - YM_i)^2$ in association with i.

When equations for sequentially partially differentiating these alignment error components Δx and Δy by the six conversion parameters a to f to respectively yield 0 are set, and these six simultaneous equations are solved, the six conversion parameters a to f are obtained. Calculations for calculating the six conversion parameters a to f of equation (1) by the least square method in this manner are called EGA calculations. Thereafter, each shot area on the wafer can be aligned on the basis of the arrangement coordinate values calculated using the first-order conversion equation using the conversion parameters a to f as coefficients. Alternatively, when sufficient approximation accuracy cannot be obtained by the first-order conversion equation, wafer alignment may be achieved using higher-order (e.g., 2nd-order or higher) equations.

In the above-mentioned EGA type alignment method, a plurality of sample shots often include a so-called isolated shot which has a particularly larger nonlinear component, obtained by subtracting a linear component from an alignment error, than those of other sample shots. Such an isolated shot is generated due to a measurement error caused by, e.g., collapse of wafer marks belonging to the sample shot on the wafer, a local nonlinear distortion on the wafer, an alignment error of a wafer stage upon transfer of a reticle pattern of the first layer onto the wafer, and the like. Therefore, when the arrangement coordinate values of other shot areas are to be calculated, alignment data (measured coordinate value) of such an isolated shot is preferably rejected.

For this reason, an isolated shot is detected by methods ① to ③ below, and the EGA type alignment is performed by rejecting the detected isolated shot.

① A shot area which has an alignment error equal to or larger than a predetermined reference value is determined to be an isolated shot. For example, FIG. 1A exaggeratingly shows an example of alignment errors of sample shots distributed on a wafer 41 as an object to be exposed. In FIG. 1A, the design arrangement coordinate values of shot areas including sample shots are determined on a coordinate system (x, y) on the wafer 41. On the other hand, the coordinate values of eight sample shots $SB_1$ to $SB_8$ (more specifically, the coordinate values of wafer marks) on a stage coordinate system (X, Y) as a coordinate system of a wafer stage on which the wafer 41 is placed are measured.

The alignment errors of the eight sample shots $SB_1$ to $SB_8$ are respectively expressed by vectors $VB_1$ to $VB_8$. For example, the start point of the vector $VB_1$ represents the design central coordinate value, on the stage coordinate system (X, Y), of the sample shot $SB_1$, and the end point of the vector $VB_1$ represents the central coordinate value, measured on the stage coordinate system (X, Y), of the sample shot $SB_1$. In this case, the design central coordinate values on the stage coordinate system (X, Y) are calculated by substituting estimated values of the six parameters a to f and the design values on the coordinate system on the wafer in equation (1). The estimated values of the six parameters a to f are obtained by so-called global alignment, i.e., by measuring the positions, on the stage coordinate system (X, Y), of two two-dimensional alignment marks on the wafer 41 while assuming linear expansion/contraction of the six parameters to be isotropic (Rx=Ry) and the orthogonality error w to be 0.

Figure 1B:
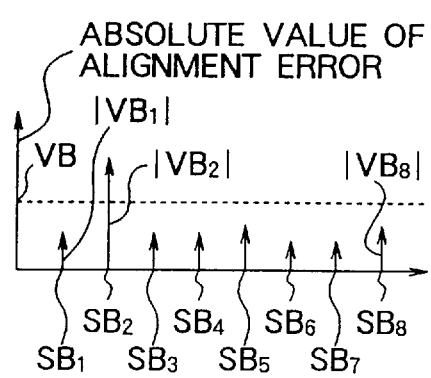
FIG. 1B is a view showing the absolute values $|VB_1|$ to $|VB_8|$ of the vectors $VB_1$ to $VB_8$ shown in FIG. 1A.

FIG. 1B shows the absolute values $|VB_1|$ to $|VB_8|$ of the vectors of the alignment errors of the eight sample shots $SB_1$ to $SB_8$ shown in FIG. 1A. A sample shot which has an absolute value equal to or larger than a predetermined reference value VB, i.e., the second sample shot $SB_2$, is rejected.

② The EGA calculations are performed to classify alignment errors into linear components and nonlinear components, and a sample shot having a nonlinear component equal to or larger than a predetermined reference value is rejected.

Figure 2A:
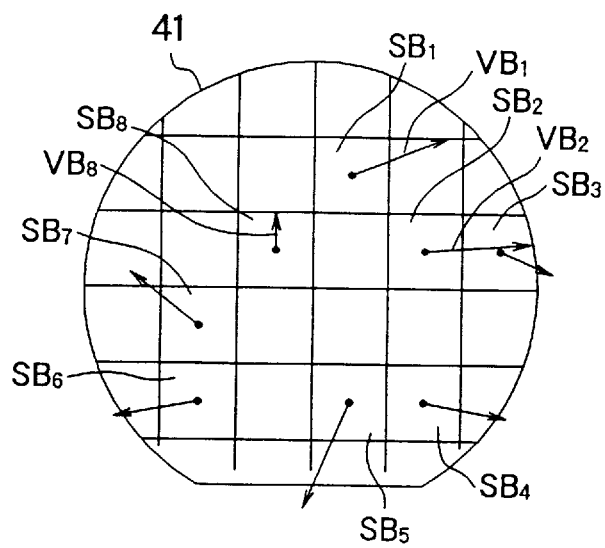
FIG. 2A is a view showing another example of the vectors $VB_1$ to $VB_8$ of the alignment errors of the eight sample shots $SB_1$ to $SB_8$ distributed on the wafer 41.
Figure 2B:
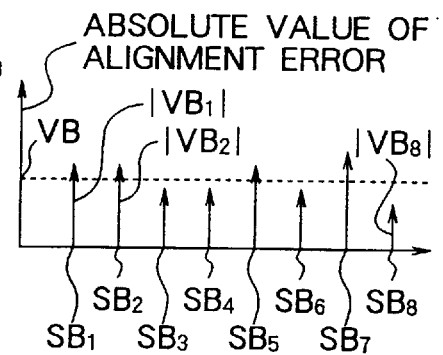
FIG. 2B is a view showing the absolute values $|VB_1|$ to $|VB_8|$ of the vectors $VB_1$ to $VB_8$ shown in FIG. 2A.

FIG. 2A shows another example of the vectors $VB_1$ to $VB_8$ of the alignment errors of the eight sample shots $SB_1$ to $SB_8$ on the wafer 41, and FIG. 2B shows the absolute values (the absolute values of alignment errors) of the vectors $VB_1$ to $VB_8$ of these sample shots $SB_1$ to $SB_8$. In this case, the values of the six conversion parameters a to f which satisfy equation (1) in a least square method manner are calculated by the EGA calculations on the basis of the design arrangement coordinate values, on the coordinate system on the wafer 41, of the sample shots, and the measured coordinate values on the stage coordinate system. These six conversion parameters a to f and design arrangement coordinate values are substituted in equation (1) to calculate computational arrangement coordinate values except for linear errors, on the stage coordinate system, of the sample shots $SB_1$ to $SB_8$. A vector from a first computational arrangement coordinate position to a computational arrangement coordinate value except for its linear error is the vector of the linear component of the alignment error.

Figure 3A:
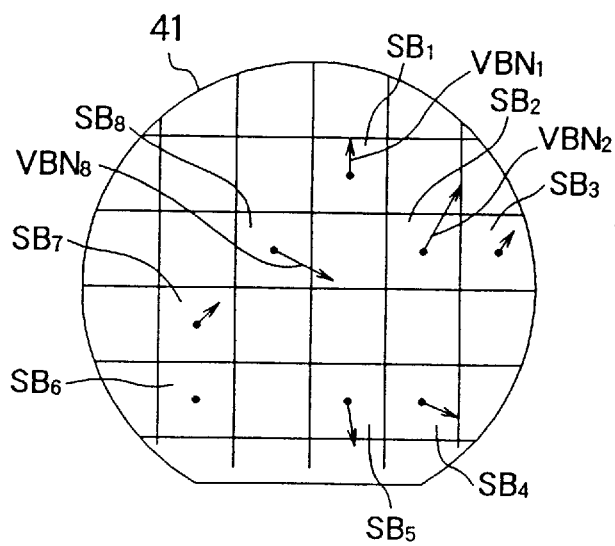
FIG. 3A is a view showing vectors obtained by subtracting the vectors of linear components from the vectors of the alignment errors shown in FIG. 2A, i.e., vectors $VBN_1$ to $VBN_8$ of nonlinear components of the sample shots $SB_1$ to $SB_8$.
Figure 3B:
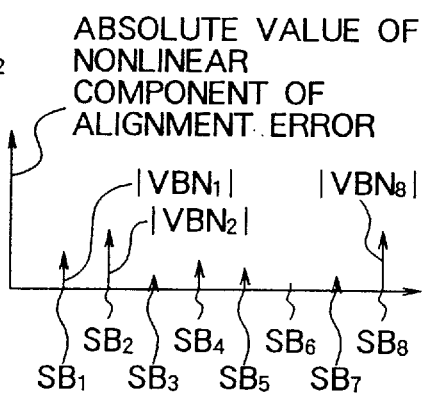
FIG. 3B is a view showing the absolute values $|VBN_1|$ to $|VBN_8|$ of the vectors $VBN_1$ to $VBN_8$ shown in FIG. 3A.

When the vectors of the linear components are subtracted from the vectors of the alignment errors shown in FIG. 2A, vectors $VBN_1$ to $VBN_8$ of nonlinear components are obtained in units of sample shots $SB_1$ to $SB_8$, as shown in FIG. 3A. FIG. 3B shows the absolute values $|VBN_1|$ to $|VBN_8|$ of the vectors of the nonlinear components of the alignment errors of the sample shots $SB_1$ to $SB_8$, and a sample shot which has a nonlinear component of an absolute value larger than a predetermined reference value, e.g., the eighth sample shot $SB_8$, is rejected.

③ Standard deviations of the absolute values of the vectors of alignment errors are calculated in units of sample shots on the wafer, and a sample shot in which the absolute value of the vector of the alignment error is equal to or larger than a predetermined multiple of the standard deviation is rejected.

Of the above-mentioned techniques, in the method of rejecting a sample shot in which the absolute value of the vector of the alignment error is equal to or larger than a predetermined reference value like in ①, for example, in the example shown in FIG. 1A, even the vector $VB_8$ which has a poor direction balance as a whole is not rejected since it has a small absolute value. When the rotation, orthogonality, or linear expansion/contraction (scaling) of the entire wafer 41 is particularly large, most of sample shots are rejected unless the predetermined reference value (a value corresponding to the reference value VB in FIG. 1B) is set to be considerably large, and accurate alignment is disabled. In addition, depending on the direction of the vector of the alignment error to be rejected, a nonlinear component may be emphasized. In this manner, a wrong sample shot may be rejected.

In the method of correcting linear components by executing the EGA calculations and comparing the absolute values of the obtained nonlinear components with a predetermined reference value like in ②, a probability that a wrong sample shot is rejected is considerably lowered unlike in ①. However, since linear components calculated in method ② are calculated using the coordinate value of an isolated shot to be rejected, it is considered that accurate linear components are not obtained. Therefore, the finally obtained absolute values (corresponding to the distribution shown in FIG. 3B) of the nonlinear components of the alignment error are inaccurate, and a wrong sample shot may be rejected, e.g., near the predetermined reference value.

Even when a reference value for rejection is statistically set to be a variable value on the basis of the standard deviations of the absolute values of the alignment errors like in ③, since linear components are not subtracted, a wrong sample shot may be rejected like in ①. Furthermore, method ③ may be combined with method ②. Even by this method, since the alignment error of a sample shot to be rejected is included as a basis of the calculations, a wrong sample shot may be rejected, e.g., near the reference value as in method ②.

An isolated shot to be rejected is reliably rejected by the following method.

First, the coordinate positions, on a second coordinate system (stage coordinate system (X, Y)), of N sample areas (sample shots $SA_1$ to $SA_N$) selected on the wafer (substrate) 41 are measured, a variation (e.g., a predetermined multiple of a standard deviation) E(N) of nonlinear components of deviation amounts of the measured N coordinate positions from their design arrangement coordinate values is calculated. Thereafter, when a region which is expected to have a large distortion on the substrate 41 is known in, e.g., the manufacturing process completed so far, a sample area $SA_h$ in the region which is expected to have a large distortion is regarded as an isolated shot and is rejected. Using the measured coordinate positions of the remaining (N−1) sample areas, a variation E(N−1, h) (e.g., a predetermined multiple of a standard deviation) of nonlinear components of deviation amounts of these (N−1) measured coordinate positions from their design arrangement coordinate positions is calculated.

Thereafter, when the variation E(N−1, h) of the (N−1) nonlinear components is smaller than the variation E(N) of the N nonlinear components, alignment is performed by, e.g., the EGA method using the measured coordinate positions of the (N−1) sample areas after the sample area $SA_h$ is rejected as an isolated shot. In this case, upon calculation of the variation E(N−1, h) of the (N−1) nonlinear components, since the measurement result of the sample area $SA_h$ as an isolated shot is not included, the variation of the nonlinear components can be accurately evaluated. Therefore, an isolated shot which has a large linear component of the deviation amount (alignment error) of the measured coordinate position from the design coordinate position can be accurately rejected, and alignment accuracy can be improved.

In the above-mentioned fourth step, when the variation E(N−1, h) of the (N−1) nonlinear components calculated in the third step is smaller than the variation E(N) of the N nonlinear components calculated in the second step, a sample area $SA_f$ in a region which is expected to have a large distortion is further rejected as a second isolated shot from the (N−1) sample areas used in the third step. A variation E(N−2, f) of the nonlinear components of the deviation amounts of the measured coordinate positions of the obtained (N−2) sample areas is calculated. When the variation E(N−2, f) of the (N−2) nonlinear components is smaller than the variation E(N−1, h) of the (N−1) nonlinear components, the sample area $SA_f$ is rejected as an isolated shot. Thereafter, isolated shots are similarly rejected. Even when there are a plurality of isolated shots, all these isolated shots can be accurately rejected, and accurate alignment can be performed.

In the third step, nonlinear components of deviation amounts of (N−1) sample areas obtained by sequentially excluding an i-th (i is an integer from 1 to N) sample area from the N sample areas are calculated on the basis of the coordinate positions measured in the first step, and variations E(N−1, i) of N sets of (N−1) nonlinear components from their design coordinate positions are calculated. When a minimum one of these variations of the N sets of nonlinear components is to be calculated, a sample area $SA_h$, which has the largest nonlinear component, of these N sample areas, can be specified as an isolated shot. In addition, since calculations are made on the basis of the measurement results of the remaining samples obtained by rejecting an isolated shot, evaluation can be accurately achieved.

Embodiment 1

The first embodiment of the alignment method according to the present invention will be described below with reference to the accompanying drawings. In this embodiment, the present invention is applied to the alignment operation of an exposure apparatus (stepper) which exposes a pattern image on a reticle onto each shot area on a wafer as a photosensitive substrate by the step-and-repeat method. Note that the present invention can also be applied to a scanning exposure type exposure apparatus such as a step-and-scan type apparatus.

FIG. 4 shows an exposure apparatus of this embodiment. Referring to FIG. 4, exposure light IL emerging from an illumination optical system 1 illuminates a reticle 2 with an almost uniform illuminance. The reticle 2 is held on a reticle stage 3, and the reticle stage 3 is movable and finely rotatable in a two-dimensional plane on a base 4. A main control system 6 for controlling the operation of the entire apparatus controls the operation of the reticle stage 3 via a driving device 5 on the base 4.

Under the exposure light IL, a pattern image on the reticle 2 is projected onto each shot area on a wafer 8 via a projection optical system 7. The wafer 8 is placed on a wafer stage 10 via a wafer holder 9. A Z-axis is defined in a direction parallel to the optical axis of the projection optical system 7, and an orthogonal coordinate system of a two-dimensional plane perpendicular to the Z-axis is taken to define X- and Y-axes. The wafer stage 10 is constituted by an X-Y stage for two-dimensionally aligning the wafer 8 in a plane perpendicular to the optical axis of the projection optical system 7, a Z stage for aligning the wafer 8 in the Z-direction parallel to the optical axis of the projection optical system 7, a stage for finely rotating the wafer 8, and the like.

A movable mirror 11 is fixed on the upper surface of the wafer stage 10, and a laser interferometer 12 is arranged to oppose the movable mirror 11. Although simply illustrated in FIG. 4, the movable mirror 11 is constituted by a plane mirror which has a reflection surface perpendicular to the X-axis, and a plane mirror which has a reflection surface perpendicular to the Y-axis. The laser interferometer 12 is constituted by two X-axis laser interferometers for irradiating laser beams toward the movable mirror 11 along the X-axis, and a single Y-axis laser interferometer for irradiating a laser beam toward the movable mirror 11 along the Y-axis. One X-axis laser interferometer and the Y-axis laser interferometer measure the X- and Y-coordinates of the wafer stage 10. The coordinate system (X, Y) defined by the X- and Y-coordinates measured in this manner will be referred to as a stage coordinate system or a still coordinate system hereinafter.

The rotational angle of the wafer stage 10 is measured on the basis of the difference between the measurement values of the two X-axis laser interferometers. The X-coordinate information, Y-coordinate information, and rotational angle information measured by the laser interferometer 12 are supplied to a coordinate measurement circuit 12a and the main control system 6. The main control system 6 controls the alignment operation of the wafer stage 10 via a driving device 13 while monitoring the supplied coordinates. Although not shown in FIG. 4, the same three-axis interferometer system as that at the wafer side is also provided to the reticle side.

An imaging characteristic controller 14 is attached to the projection optical system 7 of this embodiment. The imaging characteristic controller 14 adjusts the projection magnification and distortion of the projection optical system 7 by adjusting the interval between predetermined lens groups of those constituting the projection optical system 7 or by adjusting the pressure of a gas in a lens chamber between the predetermined lens groups. The operation of the imaging characteristic controller 14 is also controlled by the main control system 6.

An off-axis type alignment system 15 which adopts an imaging processing method is arranged on the side surface of the projection optical system 7. In this alignment system 15, illumination light from a light source 16 is irradiated onto a position near an X-axis wafer mark (alignment mark) Mx on the wafer 8 via a collimator lens 17, a beam splitter 18, a mirror 19, and an objective lens 20. In this case, a base line amount as the interval between an optical axis 20a of the objective lens 20 and an optical axis 7a of the projection optical system 7 is measured in advance. Light reflected by the wafer mark Mx is irradiated onto an index plate 22 via the objective lens 20, the mirror 19, the beam splitter 18, and a focusing lens 21, and an image of the wafer mark Mx is formed on the index plate 22.

The light transmitted through the index plate 22 propagates toward a beam splitter 24 via a first relay lens 23, and the light transmitted through the beam splitter 24 is focused on the imaging surface of an X-axis image pickup element 26X comprising a two-dimensional CCD by an X-axis second relay lens 25X. On the other hand, the light reflected by the beam splitter 24 is focused on the imaging surface of a Y-axis image pickup element 26Y comprising a two-dimensional CCD by a Y-axis second relay lens 25Y. On the imaging surfaces of the image pickup elements 26X and 26Y, the image of the wafer mark Mx and the images of index marks on the index plate 22 are formed to overlap each other. The image pickup signals from the image pickup elements 26X and 26Y are supplied to the coordinate measurement circuit 12a.

Figure 5:
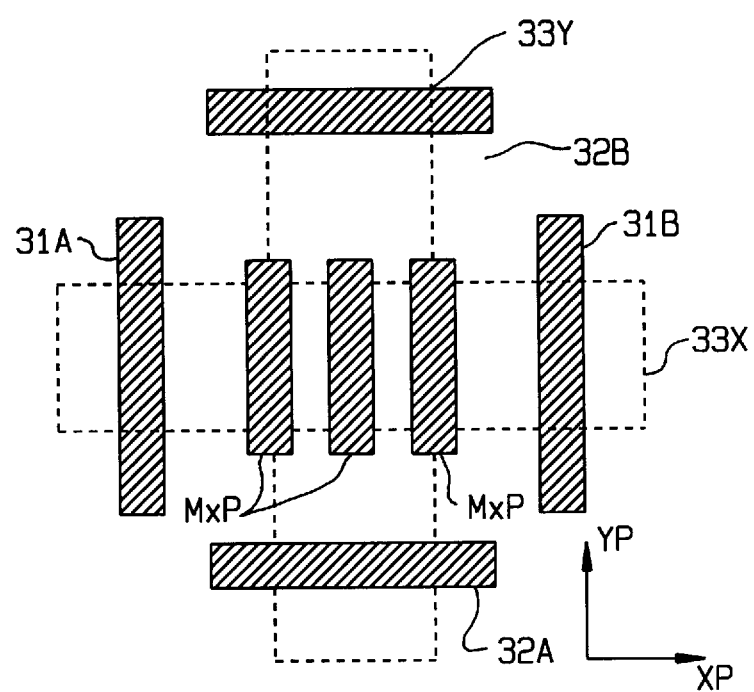
FIG. 5 is a view showing an example of images on an index plate of an off-axis type alignment system 15 in FIG. 4.

FIG. 5 shows a pattern on the index plate 22 shown in FIG. 4. Referring to FIG. 5, an image MxP of the wafer mark Mx consisting of three linear patterns are formed at the central portion. An XP direction as the pitch direction of the image MxP and a YP direction as the longitudinal direction of the image MxP are respectively conjugate with the X- and Y-directions of the stage coordinate system of the wafer stage 10 shown in FIG. 4. Two index marks 31A and 31B are formed to sandwich the wafer mark image MxP therebetween along the XP direction, and two index marks 32A and 32B are formed to sandwich the wafer mark image MxP therebetween along the YP direction.

In this case, images in a detection region 33X which surrounds the index marks 31A and 31B and the wafer mark image MxP in the XP direction are picked up by the X-axis image pickup element 26X in FIG. 4, and images in a detection region 33Y which surrounds the index marks 32A and 32B, and an image of a Y-axis wafer mark (not shown; a pattern obtained by rotating the X-axis wafer mark Mx through 90°) in the YP direction are picked up by the Y-axis image pickup element 26Y in FIG. 4. The scanning directions upon reading of photoelectric conversion signals from the pixels of the image pickup elements 26X and 26Y are respectively set in the XP and YP directions. Thus, by processing the image pickup signals from the image pickup elements 26X and 26Y, the positional deviation amount, in the XP direction, between the X-axis wafer mark image MxP and the index marks 31A and 31B, and the positional deviation amount, in the YP direction, between the Y-axis wafer mark image and the index marks 32A and 32B can be obtained. Therefore, in FIG. 4, the coordinate measurement circuit 12a measures the X-coordinate, on the stage coordinate system (X, Y), of the wafer mark Mx on the basis of the positional relationship between the image of the wafer mark Mx on the wafer 8 and the index marks on the index plate 22a and the measurement results from the laser interferometer 12 at that time, and supplies the measured X-coordinate to the main control system 6. Similarly, the Y-coordinate, on the stage coordinate system (X, Y), of the Y-axis wafer mark is also measured, and is supplied to the main control system 6.

The operation executed when each of shot areas on the wafer to be exposed is aligned, and a pattern image on the reticle 2 is exposed on each shot area in this embodiment will be described below with reference to the flow chart in FIG. 6. The wafer 8 to be exposed is loaded onto the wafer holder 9 shown in FIG. 4.

Figure 7:
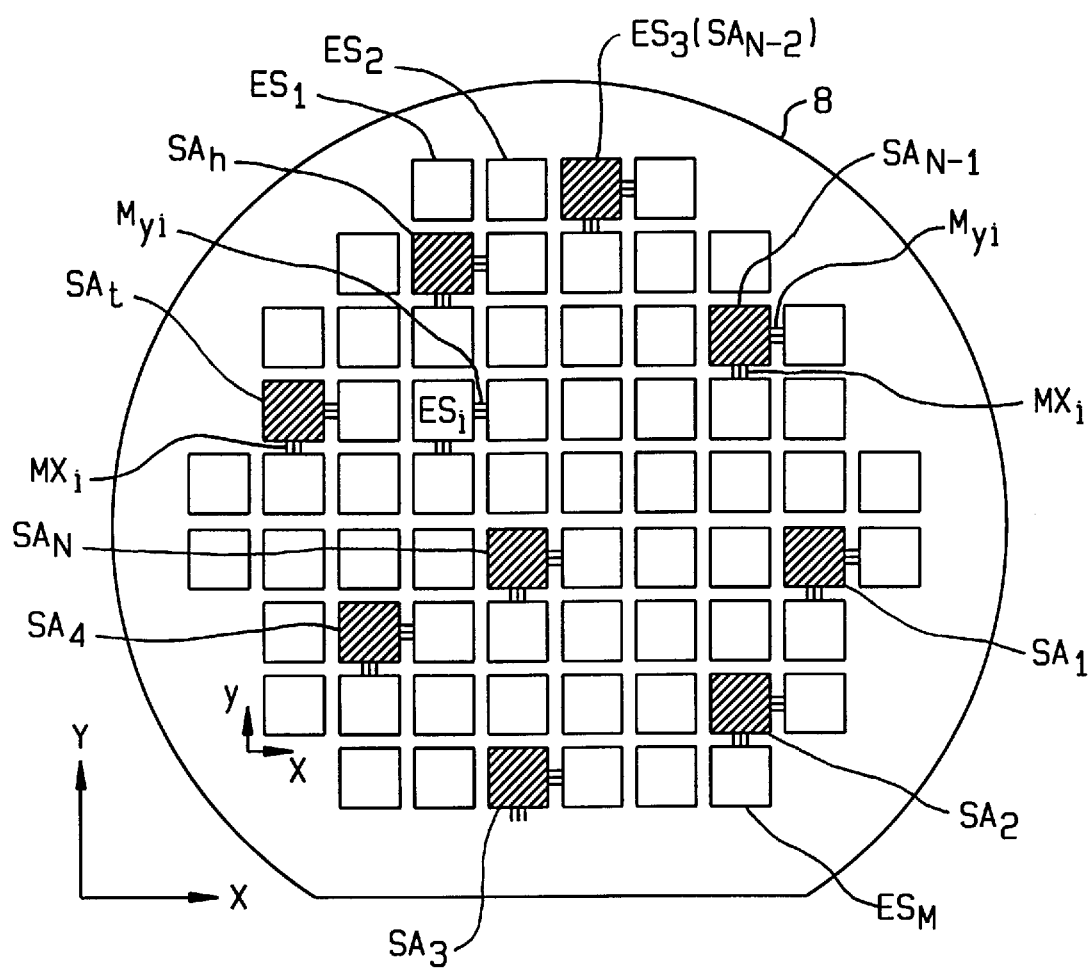
FIG. 7 is an enlarged plan view showing the arrangement of sample shots on a wafer 8 to be exposed by the method of the first embodiment.

FIG. 7 shows the arrangement of shot areas on the wafer 8. Referring to FIG. 7, shot areas $ES_1$, $ES_2$, ..., $ES_M$ (M is an integer equal to or larger than 3) are regularly formed on the wafer 8 along the coordinate system (x, y) set on this wafer, and chip patterns are respectively formed on the respective shot areas $ES_i$ (i=1 to M) in the process completed so far. The shot areas $ES_i$ are separated by street lines with a predetermined width in the x- and y-directions. X-axis wafer marks $Mx_i$ are formed at the central portions of the street lines which contact the shot areas $ES_i$ and extend in the x-direction, and Y-axis wafer marks $My_i$ are formed at the central portions of the street lines which contact the shot areas $ES_i$ and extend in the y-direction.

Each of the X- and Y-axis wafer marks $Mx_i$ and $My_i$ is defined by arranging three linear patterns at a predetermined pitch in a corresponding one of the x- and y-directions. These patterns are formed as recess or projecting patterns on the undercoat of the wafer 8. An x-coordinate (design coordinate value) $x_i$ of each wafer mark $Mx_i$ on the coordinate system (x, y) on the wafer 8, and a y-coordinate (design coordinate value) $y_i$ of each wafer mark $My_i$ are known, and are stored in a storage unit in the main control system 6 shown in FIG. 4. In this case, the x-coordinate of each wafer mark $Mx_i$ and the y-coordinate of each wafer mark $My_i$ are respectively regarded as the x- and y-coordinates of a corresponding shot area $ES_i$.

Also, two two-dimensional global alignment marks (not shown) for rough alignment (global alignment) are formed on the wafer 8, and the coordinate values of these two global alignment marks on the coordinate system (x, y) on the wafer 8 are known. After the number of unknown conversion parameters of equation (1) is reduced to four by assuming linear expansion/contraction to be isotropic (Rx= Ry) and the orthogonality error w of the stage coordinate system to be 0, the main control system 6 shown in FIG. 4 measures the coordinate values, on the stage coordinate system (X, Y), of the two two-dimensional global alignment marks on the wafer 8 via the alignment system 15. Based on the measurement results, the values of the simplified four conversion parameters in equation (1) are determined.

Thereafter, the main control system 6 calculates an initial value of a computational X-coordinate of each wafer mark $Mx_i$ and an initial value of a computational Y-coordinate of each wafer mark $My_i$ on the stage coordinate system (X, Y) by substituting these four conversion parameters, the design x-coordinate of each wafer mark $Mx_i$, and the design y-coordinate of each wafer mark $My_i$ in equation (1). At the same time, the main control system 6 calculates an initial value of a computational Y-coordinate of the center of each wafer mark $Mx_i$ and an initial value of a computational X-coordinate of the center of each wafer mark $My_i$. By driving the wafer stage 10 on the basis of the initial values of the design coordinate values on the stage coordinate system (X, Y), the wafer marks $Mx_i$ and $My_i$ are sequentially driven into an observation field of the alignment system 15, and their accurate coordinate values are measured.

Finally, in this embodiment as well, coordinate conversion from the coordinate system (x, y) on the wafer 8 into the stage coordinate system (X, Y) is expressed by equation (1) using the six conversion parameters a to f. These six conversion parameters are determined as follows.

Figure 6:
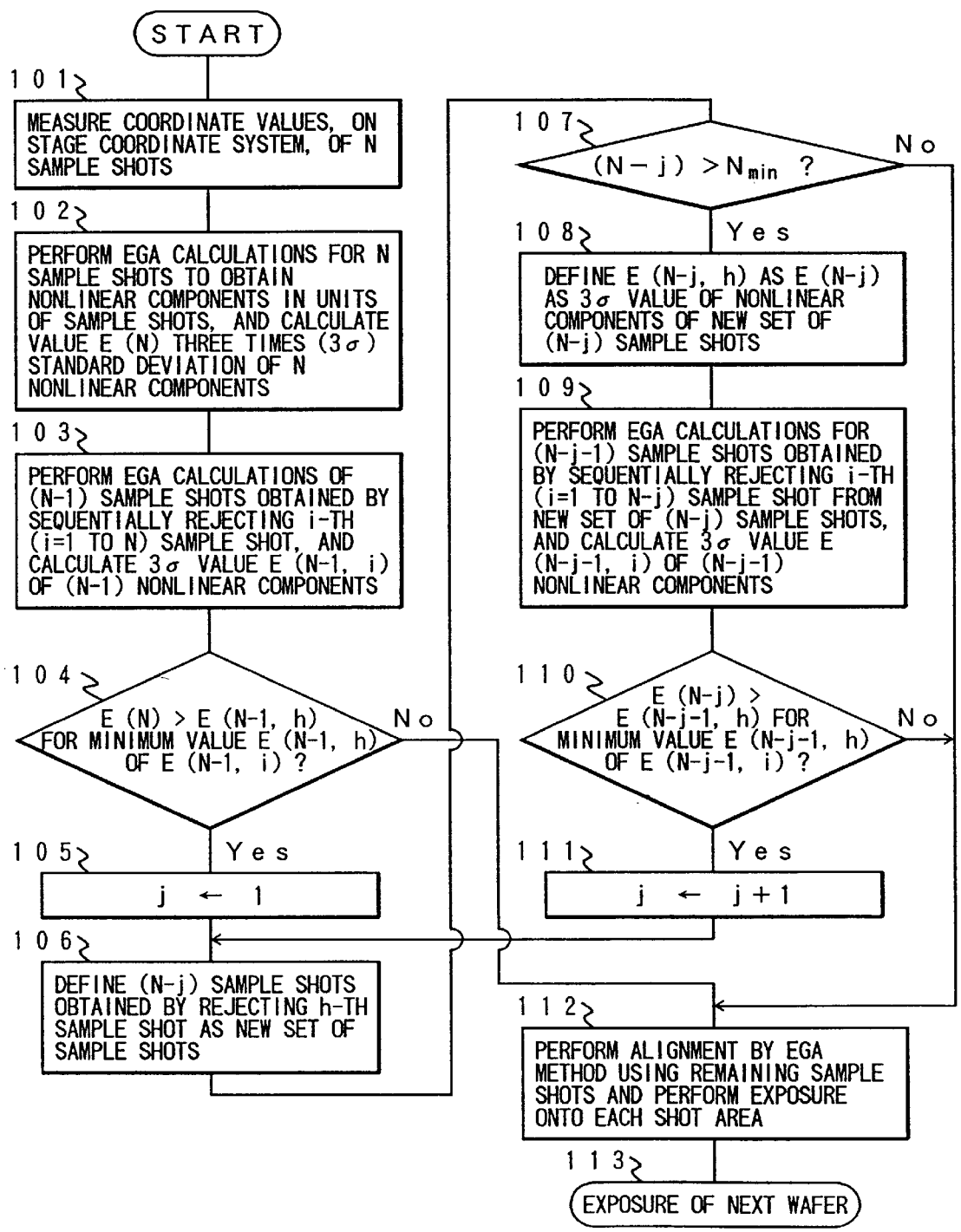
FIG. 6 is a flow chart showing an exposure method to which the first embodiment of an alignment method according to the present invention is applied.

In step 101 in FIG. 6, N (in FIG. 7, N=9) sample shots $SA_1$ to $SA_N$ are selected in an arbitrary arrangement from all shot areas $ES_1$ to $ES_M$ on the wafer 8, as shown in FIG. 7, and the coordinate values, on the stage coordinate system (X, Y), of the sample shots $SA_i$ (i=1 to N) are measured via the alignment system 15 shown in FIG. 4. Measuring the coordinate value of each sample shot $SA_i$ is to measure the coordinate values, on the stage coordinate system (X, Y), of the X- and Y-axis wafer marks of the sample shot $SA_i$. The coordinate value of each sample shot $SA_i$ measured on the stage coordinate system (X, Y) is represented by ($XM_i$, $YM_i$). In this case, an initial value (design value) of the computational coordinate value on the stage coordinate system (X, Y), which initial value is used for driving each sample shot $SA_i$ into the observation field of the alignment system 15, is represented by ($X_{0i}$, $Y_{0i}$).

In step 102, nonlinear components of alignment errors in units of N sample shots $SA_i$ are obtained. The alignment error is an error between the computational coordinate value and the actually measured coordinate value. The alignment error of each sample shot $SA_i$ is numerically expressed by a vector $V_i$ which has the initial value ($X_{0i}$, $Y_{0i}$) of the computational coordinate value as a start point, and the measured coordinate value ($XM_i$, $YM_i$) as an end point.

Figure 8A:
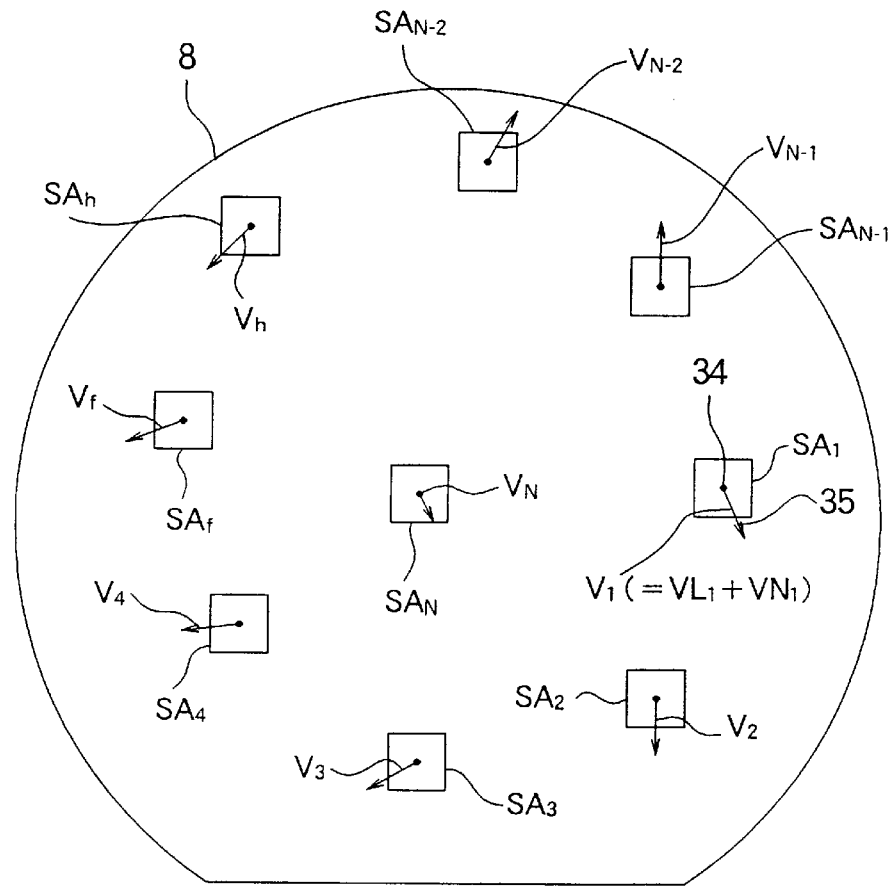
FIG. 8A is an enlarged plan view exaggeratingly showing the vectors of alignment errors of sample shots measured by the method of the first embodiment.

FIG. 8A exaggeratingly shows vectors $V_1$ to $V_N$ of the alignment errors of the N sample shots $SA_1$ to $SA_N$ on the wafer 8. Referring to FIG. 8A, for example, a start point 34 of the vector $V_1$ of the shot area $SA_1$ corresponds to the initial value of the computational coordinate value, and an end point 35 corresponds to the measured coordinate value. In this case, each vector $V_i$ is expressed by a sum of a linear portion $VL_i$ and a nonlinear portion $VN_i$. Since the nonlinear portion $VN_i$ corresponds to a component generated due to the measurement error, a local distortion on the wafer 8, or the like, the nonlinear component is obtained as follows.

First, the main control system 6 calculates the values of the six conversion parameters a to f which satisfy equation (1) using a simple least square method on the basis of the design coordinate values and measured coordinate values of the N sample shots (in other words, their wafer marks). Such calculations are called EGA calculations. In the EGA calculations, when the coordinate value of an n-th sample shot $SA_n$ measured on the stage coordinate system is represented by ($XM_n$, $YM_n$), and the coordinate value calculated by substituting the design coordinate value and the six conversion parameters in equation (1) is represented by ($X_n$, $Y_n$), the residual error component is given by the following formula:

$$\text{Residual error component} = \sum_{n=1}^{m} \{(X_n - XM_n)^2 + (Y_n - YM_n)^2\} \quad (2)$$

Note that the value of m is 9 in the example shown in FIG. 8A.

The values of the conversion parameters a to f in equation (1) are determined to minimize the residual error component. Then, the main control system 6 calculates vectors by subtracting computational arrangement coordinate values ($X_i$, $Y_i$) calculated using the conversion parameters a to f obtained as described above from the coordinate values ($XM_i$, $YM_i$) of the sample shots $SA_i$. Furthermore, the main control system 6 calculates the absolute values of these vectors to obtain nonlinear components of the alignment components of the N sample shots $SA_1$ to $SA_N$. More specifically, the nonlinear component is the absolute value of the nonlinear portion $VN_i$ of the vector $V_i$ which represents the alignment error. Thereafter, the main control system 6 calculates a value E(N) three times the standard σ deviation of the nonlinear components of the alignment errors of the N sample shots. The value E(N) is shown in the left end portion in FIG. 8B.

In step 103, the main control system 6 performs the above-mentioned EGA calculations of the (N−1) sample shots $SA_2$ to $SA_N$ obtained by rejecting the first sample shot $SA_1$ from the N sample shots $SA_1$ to $SA_N$ to obtain the six conversion parameters of equation (1). More specifically, the main control system 6 determines the values of the six conversion parameters a to f of equation (1), which minimize the residual error component as a square sum of the difference between the coordinate values ($XM_n$, $YM_n$), measured on the stage coordinate system, of the (N−1) sample shots $SA_2$ to $SA_N$, and the design coordinate values ($X_n$, $Y_n$) based on equation (1). Then, the main control system 6 calculates the nonlinear components of the alignment errors by subtracting the computational coordinate values from the coordinate values measured on the stage coordinate system (X, Y) in units of (N−1) sample shots $SA_2$ to $S_{AN}$, and calculates a 3σ value E(N−1, 1) of these (N−1) nonlinear components.

Similarly, the main control system 6 performs the EGA calculations of (N−1) sample shots obtained by sequentially rejecting the second, third, . . . , N-th sample shots from the N sample shots $SA_1$ to $SA_N$ in FIG. 8A to obtain the nonlinear components of the alignment errors, and then calculates 3σ values of these (N−1) nonlinear components. The 3σ value of the nonlinear components of the alignment errors of the (N−1) sample shots obtained when the i-th sample shot $SA_i$ (i=1 to N) is rejected is represented by E(N−1, i).

Figure 8B:
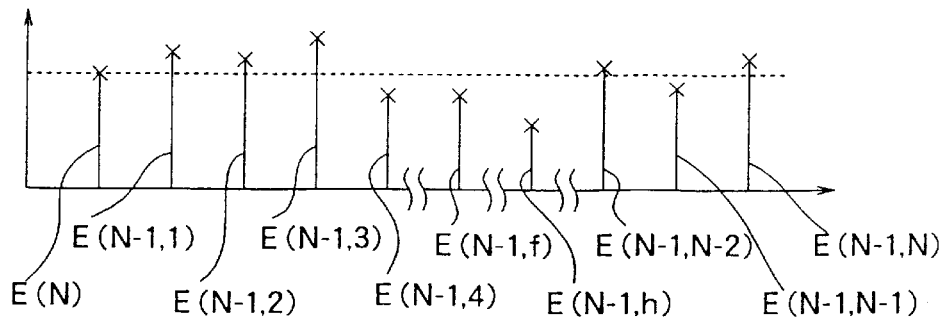
FIG. 8B is a view showing values three times (3σ) the standard deviations of nonlinear components of alignment errors associated with the sample shots shown in FIG. 8A.
Figure 9A:
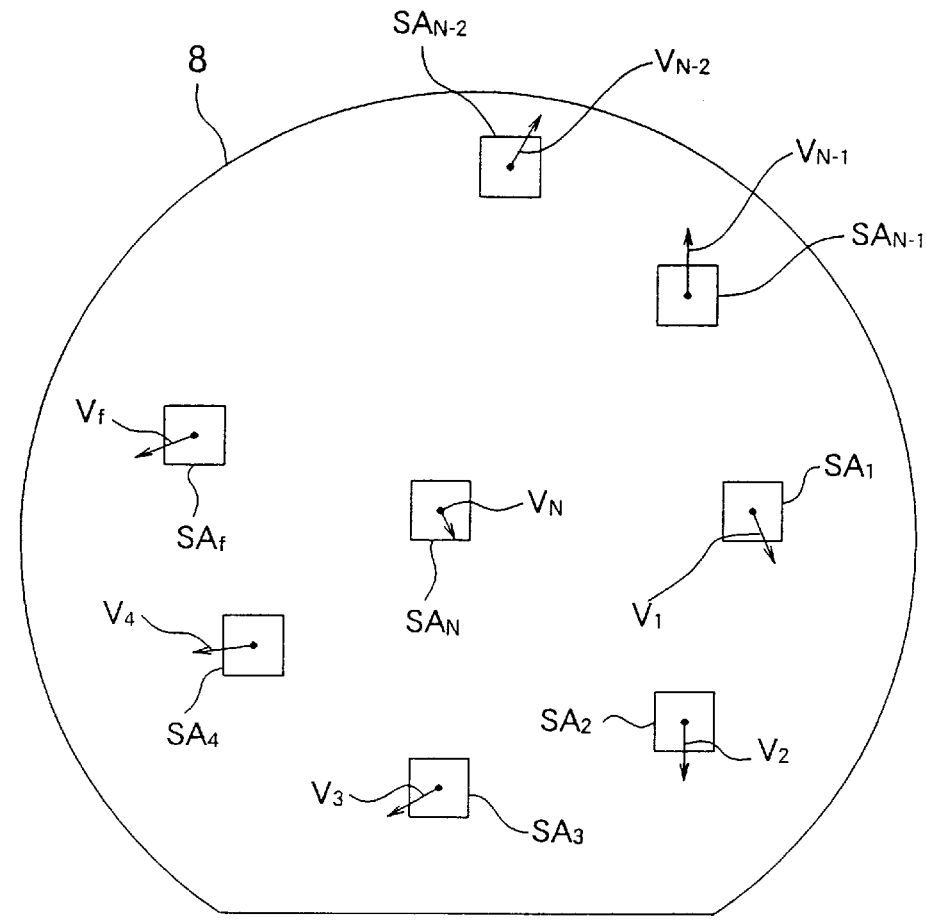
FIG. 9A is an enlarged plan view exaggeratingly showing the vectors of alignment errors of sample shots after a sample shot $SA_h$ is excluded from FIG. 8A.

FIG. 8B shows these N 3σ values E(N−1, 1) to E(N−1, N). As shown in FIG. 8B, a minimum value of the 3σ values E(N−1, 1) to E(N−1, N) is E(N−1, h), i.e., the variation of the nonlinear components of the alignment errors obtained when the h-th sample shot $SA_h$ is rejected. When the 3σ values E(N−1, i) include a plurality of minimum values, a value corresponding to a rejected sample shot having the smallest number is adopted. The flow then advances to step 104, and the main control system 6 compares the minimum value E(N−1, h) of the 3σ values E(N−1, i) with the 3σ value E(N) calculated in step 102. If E(N) is larger than E(N−1, h), i.e., E(N)>E(N−1, h) holds, the flow advances to step 105 to set an initial value of a variable j to be 1. Thereafter, in step 106, the remaining (N−j) sample shots (in this case, (N−1) sample shots) after the h-th sample shot $SA_h$ is rejected is defined as a new set of sample shots, as shown in FIG. 9A, and the flow advances to step 107.

This means to redo the EGA type alignment by rejecting the sample shot $SA_h$ with a particularly large nonlinear component of the alignment error, i.e., an isolated shot. Thus, alignment can be performed with high accuracy by rejecting an isolated shot as a sample shot causing a measurement error or a sample shot in a region with a large distortion. In addition, the 3σ value E(N−1, h) used for confirming whether or not the h-th sample shot is to be rejected is calculated without the measurement value of the h-th sample shot. For this reason, a sample shot to be rejected can be accurately determined.

On the other hand, if it is determined in step 104 that the 3σ value E(N) is equal to or smaller than the 3σ value E(N−1, h), since the nonlinear component does not decrease even when the sample shot is rejected, it is considered that a sample shot with a particularly large nonlinear component is not present. For this reason, the flow advances to step 112, and the EGA type alignment is performed using the initial N sample shots $SA_1$ to $SA_N$ to expose a pattern image on the reticle 2 onto each of the shot areas $ES_1$ to $ES_M$ on the wafer 8. More specifically, the values of the six conversion parameters a to f of equation (1) are determined by the least square method using the measurement values of the initial N sample shots $SA_1$ to $SA_N$, and the arrangement coordinate values, on the stage coordinate system (X, Y), of these shot areas are calculated on the basis of these six conversion parameters, and the design arrangement coordinate values of the shot areas $ES_1$ to $ES_M$. Based on the calculated arrangement coordinate values, these shot areas are aligned. Thereafter, the flow advances to step 113 to perform exposure of the next wafer.

Reverting to step 107, it is checked in step 107 if the number (N−j) (in this case, (N−1)) of the remaining sample shots is larger than a predetermined minimum value $N_{min}$ ($N_{min}$ is an integer equal to or larger than 1). If the number (N−j) is larger than the minimum value $N_{min}$, the flow advances to step 108. If the number (N−j) is decreased to the minimum value $N_{min}$, the flow advances to step 112, and the EGA type alignment is performed using the remaining (N−j) sample shots to achieve exposure.

In step 108, the 3σ value E(N−j, h) of the nonlinear components after the h-th sample shot is rejected, which value is obtained in step 103 or 109 (to be described later), is defined as a 3σ value E(N−j) of the nonlinear components of the remaining (N−j) (in this case, (N−1)) sample shots. The value E(N−j) (when j=1) is shown at the left end portion in FIG. 9B. Thereafter, the flow advances to step 109, and the EGA calculations are performed for (N−j−1) sample shots obtained by sequentially rejecting the first, second, . . . , and (N−j)-th sample shots from the remaining (N−j) sample shots to obtain the nonlinear components of the alignment error, and the 3σ values of these (N−j−1) nonlinear components are calculated. Note that the 3σ value of the nonlinear components of the alignment errors of the (N−j−1) sample shots obtained when an i-th (i=1 to N−j) sample shot is rejected from the (N−j) sample shots is represented by E(N−j−1, i).

Figure 9B:
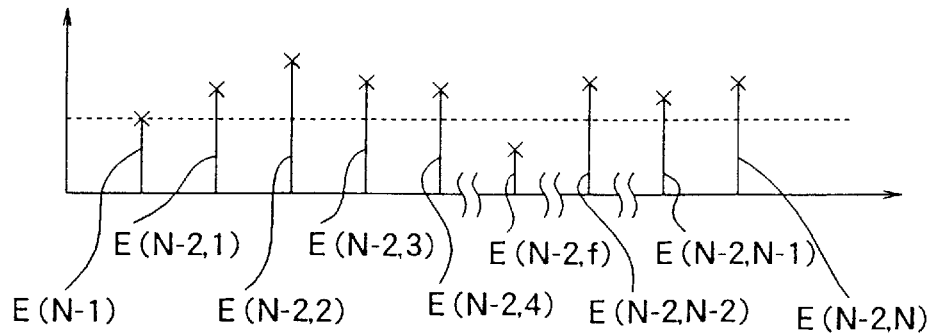
FIG. 9B is a view showing values three times (3σ) the standard deviations of nonlinear components of alignment errors associated with the sample shots shown in FIG. 9A.

FIG. 9B shows the (N−j−1) 3σ values E(N−2, 1) to E(N−2, N) obtained when j=1. In FIG. 9B, the order of sample shots to be rejected is expressed using that of the initial N sample shots. As shown in FIG. 9B, a minimum value of the 3σ values E(N−2, 1) to E(N−2, N) is E(N−2, f), i.e., the variation of the nonlinear components of the alignment errors obtained when the f-th sample shot $SA_f$ is rejected. In this case as well, when these 3σ values E(N−2, i) include a plurality of minimum values, a value corresponding to a rejected sample shot having the smallest number is adopted. The f-th sample shot is assumed to be the h-th sample shot of the (N−j) sample shots.

The flow then advances to step 110, and the main control system 6 compares the minimum value (N−j−1, h) of the 3σ values E(N−j−1, i) (in this case, E(N−2, i)) with the 3σ value E(N−j) set in step 108. If E(N−j) is larger than E(N−j−1, h), i.e., E(N−j)>E(N−j−1, h) is satisfied, the value of the variable j is incremented by one in step 111. Thereafter, the flow returns to step 106 to define the remaining (N−j) sample shots ((N−j−1) sample shots before increment of the variable j) obtained after the h-th sample shot is rejected, as a new set of sample shots, and the flow advances to step 107.

On the other hand, if it is determined in step 110 that the 3σ value E(N−j) is equal to or smaller than the 3σ value E(N−j−1, h), since the nonlinear component does not decrease even by rejecting a sample shot, it is considered that a sample shot with a particularly large nonlinear component is not present. Thus, the flow advances to step 112, and the EGA type alignment is performed using one set of remaining (N−j) sample shots. Thereafter, a pattern image on the reticle 2 is exposed onto each of the shot areas $ES_1$ to $ES_M$ on the wafer 8.

In this embodiment, steps 111 and 106 to 110 are repeated until the number of remaining sample shots decreases to $N_{min}$ in step 107 or until all the (N−j) values E(N−j−1, i) as the 3σ values of the nonlinear components obtained by rejecting a corresponding one sample shot become equal to or larger than E(N−j) in step 110. With this processing, since all isolated shots with particularly large nonlinear components of alignment errors due to the measurement error of the alignment system 15 or a local distortion on the wafer 8 are finally rejected from the N sample shots $SA_1$ to $SA_N$ shown in FIG. 7, alignment can be performed with higher accuracy. When a plurality of (about 25) wafers in a single lot are to be continuously subjected to exposure processing, isolated shots may be rejected from only the first wafer or only several wafers from the first wafer, and the EGA method may be applied to the subsequent wafers in accordance with the sample shot arrangement from which the isolated shots are rejected.

In the above-mentioned embodiment, as shown in FIG. 7, the positions of the X- and Y-axis wafer marks of the sample shots $SA_1$ to $SA_N$ are measured. However, the positions of both the X- and Y-axis wafer marks of each sample shots need not always be measured. For example, the number of sample shots may be doubled, so that the positions of only the X-axis wafer marks of odd-numbered sample shots $SA_1$, $SA_3$, . . . may be measured, and the positions of only the Y-axis wafer marks of the even-numbered sample shots $SA_2$, $SA_4$, . . . may be measured. In this case, the magnitudes of the nonlinear components of the alignment errors may be obtained in units of wafer marks, and a wafer mark with a large nonlinear component may be rejected as an isolated mark.

Even when the number of sample shots after isolated shots are rejected is equal to or larger than $N_{min}$, if it is expected that the EGA accuracy may deteriorate due to a small number of sample shots, at least one shot area may be designated as a sample shot from shot areas except for the previously selected sample shots to increase the number of sample shots.

Furthermore, step 107 is provided in FIG. 6, and if it is determined in step 107 that the number of remaining sample shots has reached $N_{min}$, the flow advances to step 112 to perform alignment and exposure. However, since the number of isolated shots with large nonlinear components is relatively smaller than that of the initial number of all sample shots, the flow normally advances from step 104 or 110 to step 112 before the number of sample shots decreases to $N_{min}$ in step 107. Therefore, step 107 need not always be provided.

The number of initially designated sample shots need only be equal to or larger than the minimum value $N_{min}$, and be equal to or smaller than the number of all shots on the wafer. Furthermore, since the minimum value $N_{min}$ is determined in accordance with the number of parameters included in the model equation (corresponding to equation (1) of this embodiment) corresponding to the regularity of the shot arrangement on the wafer, and this embodiment requires at least each three X and Y marks, $N_{min}$=3. The model equation is not limited to equation (1), and may have any other equations as long as they are set by appropriately determining parameters required for expressing the shot arrangement on the wafer. Furthermore, all the shot areas on the wafer may be designated as sample shots, and after isolated shots are rejected like in this embodiment, the sample shot arrangement (the number and positions of sample shots) may be determined on the basis of the remaining shot areas after all the isolated shots are rejected. In this case, a problem of low calculation accuracy of the EGA calculations due to a decrease in the number of alignment data (measured coordinate values) of sample shots used in the EGA method can be solved. In particular, when the sample shot arrangement is optimized in the first wafer of a lot, calculations for rejecting isolated shots need not be performed in the second and subsequent wafers unlike in this embodiment, and the processing time required for one lot can be shortened.

Although the calculation amount of this embodiment is considerably larger than that of the normal EGA method, since the computation performance of recent computers has remarkably improved, the wait time from measurement of the coordinate values of the wafer marks to exposure can be shortened to a negligible time even when the calculations of this embodiment are performed.

Embodiment 2

The second embodiment of the present invention will be described below with reference to FIG. 10. In this embodiment, when a local distortion is generated on the wafer 8, alignment is performed by a weighted EGA method as an improved EGA method. More specifically, although the basic operation of this embodiment is the same as that in the flow chart shown in FIG. 6, the operations in steps 102 to 112 in FIG. 6 are executed in units of shot areas $ES_i$ ($i$=1 to M) on the wafer 8 in FIG. 7 to determine a sample shot to be rejected, and alignment is performed using the measurement results of the remaining sample shots. In place of the EGA calculations in steps 102, 103, 109, and 112, the following weighted EGA calculations are performed.

Figure 10:
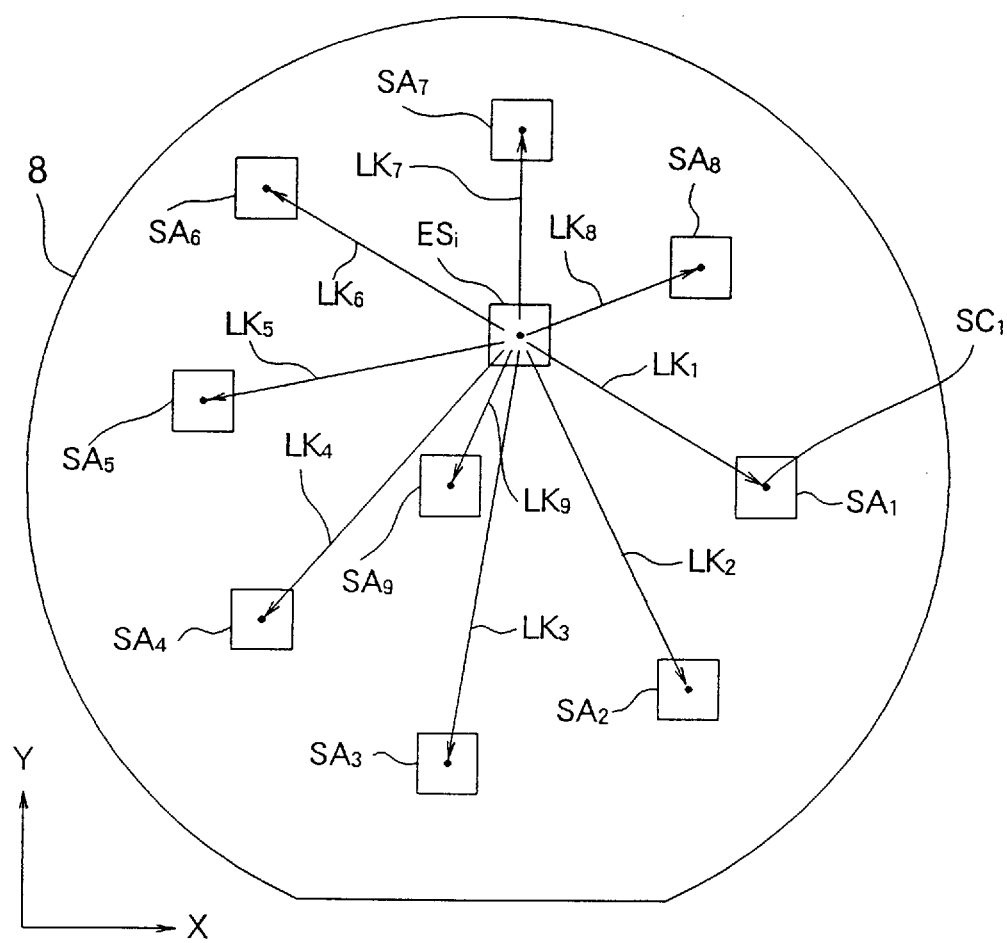
FIG. 10 is an explanatory view of an example of a method of determining weights in a weighted EGA method used in the second embodiment of the present invention.

For example, as shown in FIG. 10, when exposure onto an arbitrary shot area $ES_i$ on the wafer 8 is to be performed, the coordinate values, on the stage coordinate system (X, Y), of nine sample shots $SA_1$ to $SA_9$ are initially measured. At this time, in the step corresponding to step 102 in FIG. 6, a weight $W_{in}$ is assigned to an n-th (n=1 to 9) sample shot of the nine sample shots.

Using the measured coordinate values $(XM_n, YM_n)$ of the nine sample shots, the computational coordinate values $(X_n, Y_n)$ based on equation (1), and the weight $W_{in}$, the residual error component $Ei$ of the shot area $ES_i$ is defined as follows:

$$Ei = \sum_{n=1}^{m} W_{in}\{(X_n - XM_n)^2 + (Y_n - YM_n)^2\} \quad (3)$$

Note that the value of m is 9 in the above equation.

The values of the conversion parameters a to f are determined, so that the residual error component $Ei$ assumes a minimum value. Then, the computational arrangement coordinate values of the nine sample shots are calculated by substituting these conversion parameters a to f and the design arrangement coordinate values of the nine sample shots in equation (1). The nonlinear components (strictly speaking, nonlinear components other than a distortion around the shot area $ES_i$) of the alignment errors of the sample shots are calculated, and a 3σ value E(N) (N=9) of these nonlinear component is calculated. Thereafter, the residual error component given by equation (3) is similarly used in place of equation (2) unlike in the first embodiment. With this processing, alignment can be accurately performed in consideration of the influence of a local distortion on the wafer 8, and a sample shot having a nonlinear component which is not included in the local distortion (e.g., a measurement error) can be accurately rejected as an isolated shot.

A method of optimizing the weight $W_{in}$ will be explained below. As an example, in this embodiment, when the distance from the shot area $ES_i$ to the n-th sample shot $SA_n$ is represented by $LK_n$, as shown in FIG. 10, the weight $W_{in}$ to be given to the n-th sample shot whose measurement result is utilized is determined as follows:

$$W_{in} = \frac{1}{\sqrt{2\pi S_i}} \exp\{-LK_n^2/(2S_i)\} \quad (4)$$

Note that a parameter $S_i$ is a parameter for changing the degree of weighting.

As can be seen from this equation, as the sample shot has a shorter distance $LK_n$ to the shot area $ES_i$, the weight $W_{in}$ to be given to its measurement result becomes larger. In equation (4), when the value of the parameter $S_i$ increases, the obtained result becomes approximate to that obtained by the normal EGA method; when the value of the parameter $S_i$ decreases, the obtained result becomes approximate to that obtained by a die by die method. In this embodiment, the parameter $S_i$ is set as defined by equation (5) below. In the following equation, D is the weighting parameter. When an operator sets the value of the weighting parameter D to be a predetermined value, the parameter $S_i$, and hence, the weight $W_{in}$ are automatically determined.

$$S_i = D^2/(8 \cdot \log_e 10) \quad (5)$$

The physical meaning of this weighting parameter D is the range of sample shots (to be simply referred to as "zone" hereinafter) effective for calculating the coordinate position of each shot area on the wafer. More specifically, when the zone is wide, since the number of effective sample shots is large, the obtained result becomes approximate to that obtained by the normal EGA method. On the other hand, when the zone is narrow, since the number of effective sample shots is small, the obtained result becomes approximate to that obtained by the die by die method.

Figure 11:
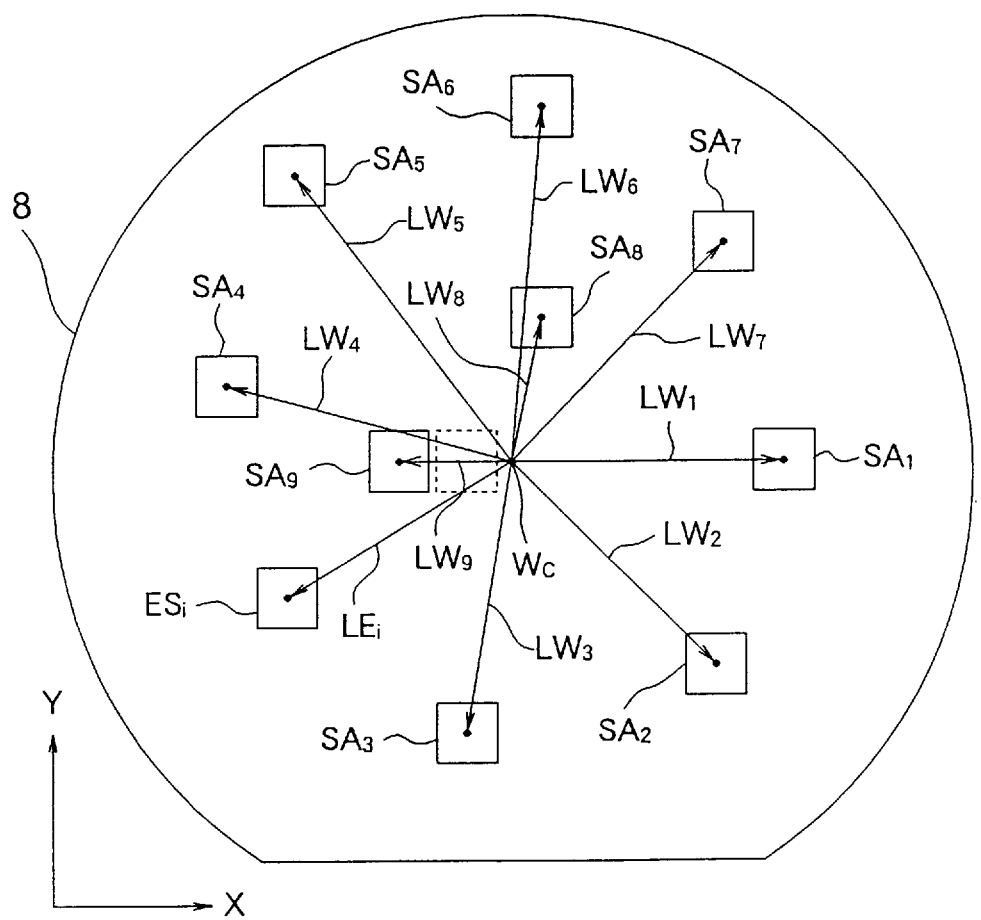
FIG. 11 is an explanatory view of another example of a method of determining weights in the weighted EGA method used in the second embodiment of the present invention.

In the above-mentioned second embodiment, the weight $W_{in}$ is determined based on equation (4) using the parameter $S_i$. Alternatively, a weight $W_{in}'$ calculated by equation (6) below using the parameter $S_i$ may be used. In this case, as shown in FIG. 11, the modification central point (e.g., the center of point symmetry of a nonlinear distortion) of the wafer 8 is defined as a wafer center $W_C$, the distance (radius) between the wafer center $W_C$ and the shot area $ES_i$ on the wafer 8 is represented by $LE_i$, and the distances (radii) between the wafer center $W_C$ and m (in FIG. 11, m=9) sample shots $SA_1$ to $SA_9$, are respectively represented by $LW_1$ to $SW_9$. The weight $W_{in}'$ defined by equation (6) below using the distance $LE_i$ and the distances $LW_n$ is given to the measurement result of the n-th sample shot $SA_n$.

$$W_{in}' = \frac{1}{\sqrt{2\pi S_i}} \exp\{(-LE_i - LW_n)^2/(2S_i)\} \quad (6)$$

Then, the weight $W_{in}$ in equation (3) for calculating the residual error component is replaced by this weight $W_{in}'$, and the conversion parameters of equation (1) are calculated by the weighted EGA method. In this case, even when the center of an almost point symmetrical distortion is present on the wafer 8, only a sample shot having a nonlinear component other than the point symmetrical distortion (e.g., a measurement error) can be accurately rejected, and alignment can be achieved with high accuracy.

In the above-mentioned embodiment, the present invention is applied to alignment of a wafer in the exposure apparatus. However, the present invention may be applied to, e.g., so-called vernier evaluation of the exposure apparatus. In this vernier evaluation, after a first measurement mark is exposed on each of a large number of shot areas on a wafer, a second measurement mark is exposed to overlap the first measurement mark in the second exposure, and after development, the deviation amount between the first and second measurement marks on a selected shot area (sample shot) on the wafer is measured. Then, the characteristics such as the regularity (registration) of the arrangement of shot areas are evaluated on the basis of the deviation amount. In this case, a sample shot with a larger nonlinear component is rejected based on the measurement results of initially selected sample shots according to the present invention, thus allowing accurate evaluation of various characteristics.

On the other hand, when the variation E(N−1, h) of the (N−1) nonlinear components is smaller than the variation E(N) of the N nonlinear components, the corresponding sample shot $SA_h$ may be rejected as an isolated shot, and when the variation E(N−1, h) of the (N−1) nonlinear components after the isolated shot is rejected has a value near a predetermined expected value $E_0$, alignment may be performed by, e.g., the EGA method using the measured coordinate positions of the remaining (N−1) sample areas.

When the variation E(N−1, h) of the (N−1) nonlinear components calculated in the above-mentioned third step does not have a value near the predetermined expected value $E_0$, the remaining (N−1) sample areas may be defined as a new set of sample areas, and the same operations as in the second and third steps may be repeated. When the variation of the nonlinear components of the sample areas after an isolated shot is rejected has reached a value near the predetermined expected value $E_0$, alignment is performed by, e.g., the EGA method using the remaining sample areas.

On the other hand, when the second and third steps are repeated within a range wherein the number of sample areas other than that rejected in the third step is equal to or larger than a predetermined allowable value $N_{min}$, the number of sample areas can be prevented from decreasing too much to destroy an averaging effect.

Embodiment 3

Figure 12:
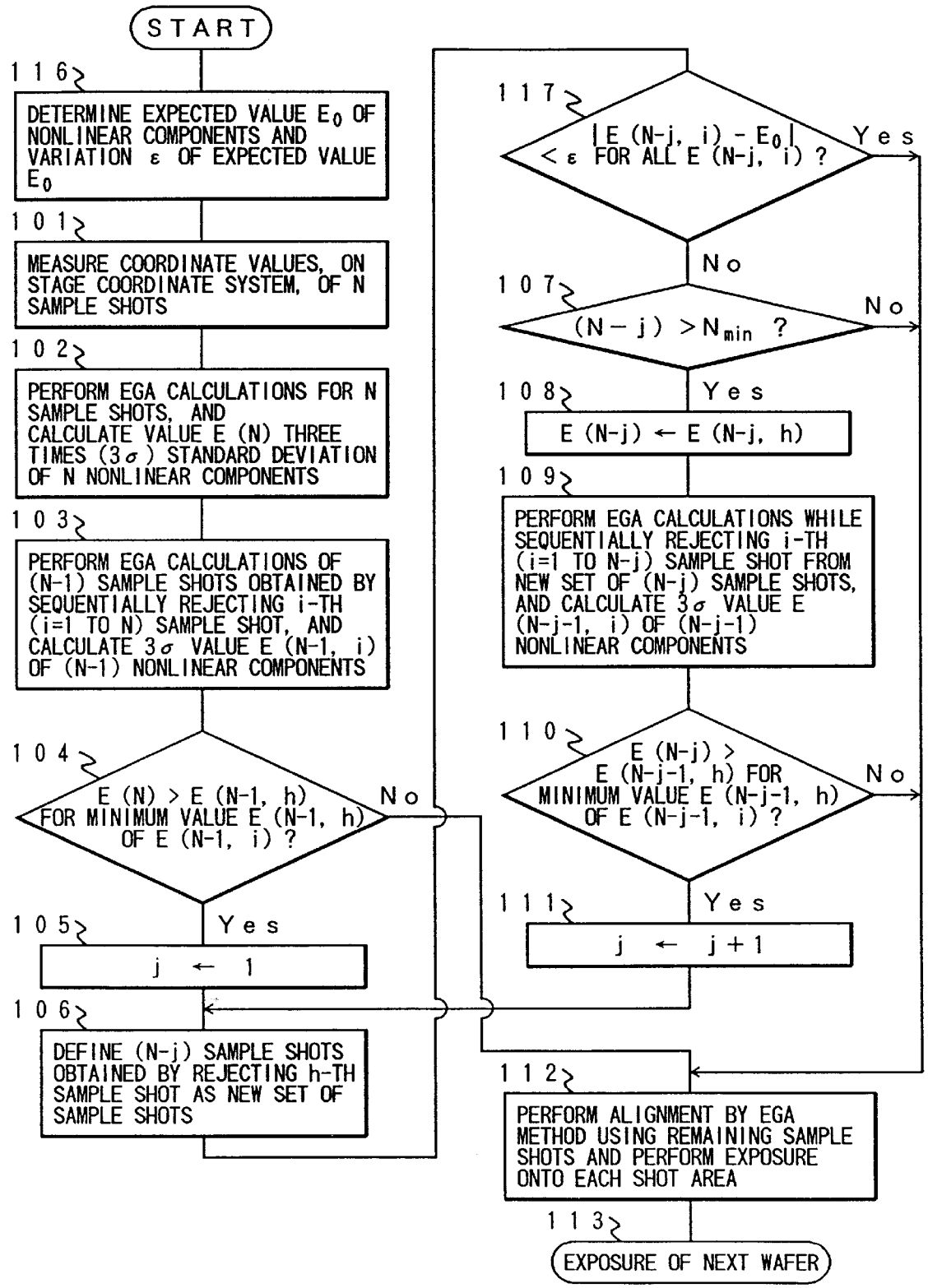
FIG. 12 is a flow chart showing an exposure method to which the third embodiment of an alignment method according to the present invention is applied.

The third embodiment of the present invention will be described below with reference to FIG. 12.

In step 116 in FIG. 12, an expected value $E_0$ (to be described later) of nonlinear components and a variation $\epsilon$ of this expected value are determined. In this embodiment, assuming that the repetitive movement accuracy (reproducibility of alignment accuracy) of the wafer stage 10 in FIG. 4 is represented by $\sigma_{step}$ and the measurement accuracy (measurement reproducibility) of the alignment system 15 is represented by $\sigma_{sens}$, the expected value $E_0$ is expressed by the square root of a sum of the squares of $\sigma_{step}$ and $\sigma_{sens}$.

$$E_0 = (\sigma_{step}^2 + \sigma_{step}^2)^{1/2} \qquad (7)$$

The variation $\epsilon$ is set to be, e.g., a fraction of the expected value $E_0$.

Then, steps 101 to 106 are executed. Since these steps are the same as those shown in FIG. 6, a detailed description thereof will be omitted.

In step 117, it is checked for all the (N−j+1) (in this case, N) 3σ values E(N−j, i) (i=1 to N−j+1) calculated in the same step 103 or 109 as that described above if the following relation is satisfied:

$$|E(N-j, i) - E_0| < \epsilon \qquad (8)$$

More specifically, it is checked if all the 3σ values E(n−j, i) coincide with the expected value $E_0$ within the range of the variation $\epsilon$. If inequality (8) is satisfied for all the 3σ values E(n−j, i), since it is considered that all isolated shots with larger nonlinear components are rejected, the flow advances to step 112 as in the above-mentioned operation. Then, alignment is performed by the EGA method using the remaining (N−j) sample shots to perform exposure. On the other hand, if at least one of the 3σ values E(n−j, i) does not satisfy inequality (8), since the remaining sample shots still include an isolated shot with a larger nonlinear component, the flow returns to step 107 as in the above-mentioned operation.

Since steps 107 to 113 are the same as those shown in FIG. 6, a detailed description thereof will be omitted.

In this embodiment, steps 111, 106, 117, and 107 to 110 are repeated until all the 3σ values E(n−j, i) coincide with the expected value $E_0$ with the range of the variation $\epsilon$ in step 117, until the number of remaining sample shots decreases to $N_{min}$ in step 107, or until all the (N−j) values E(N−j−1, i) as the 3σ values of the nonlinear components respectively obtained by rejecting one sample shot become equal to or larger than E(N−j) in step 110. With this processing, since all isolated shots with particularly large nonlinear components of alignment errors due to the measurement error of the alignment system 15 or a local distortion on the wafer 8 are finally rejected from the N sample shots $SA_1$ to $SA_N$ shown in FIG. 7, alignment can be performed with higher accuracy.

The expected value $E_0$ is not limited to that given by equation (7). For example, $\sigma_{step}$ and $\sigma_{sens}$ may be multiplied with weights and, then, the products may be averaged. Also, one of $\sigma_{step}$ and $\sigma_{sens}$ may be used upon determination of the expected value $E_0$, and error factors other than $\sigma_{step}$ and $\sigma_{sens}$ may be taken into consideration. To summarize, the expected value $E_0$ can be determined based on factors ($\sigma_{step}$, $\sigma_{sens}$, and the like) other than a true nonlinear error of an isolated shot included in the above-mentioned nonlinear component. In addition, the variation $\epsilon$ may be determined in correspondence with required alignment accuracy or the like.

In the above-mentioned embodiment, the minimum value $N_{min}$ as the number of finally remaining sample shots is determined. Instead, a maximum value $N_{max}$ of the number of sample shots to be rejected as isolated shots may be determined, and when the number of isolated shots has reached $N_{max}$, alignment may be performed by the EGA method using the remaining sample shots.

As the expected value of the 3σ value of nonlinear components in the case of the vernier evaluation described above, the square root of a sum of the squares of $\sigma1_{step}$ and $\sigma2_{step}$ as repetitive movement accuracy (reproducibility of alignment precision) of the wafer stage of the exposure apparatus used in the first and second exposure processes, and $\sigma_{sens}$ as measurement precision of the sensor for measuring the positional deviation amount between the first and second measurement marks may be used.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 16115/1994 filed on Feb. 10, 1994 and 16116/1994 filed on Feb. 10, 1994 are hereby incorporated by reference.

What is claimed is:

1. A method of aligning each of a plurality of areas on a substrate to a predetermined position in a coordinate system for defining a moving position of said substrate, comprising:
    a first step of measuring coordinate positions, on the coordinate system, of N (N is an integer not less than 2) sample areas selected from the plurality of areas;
    a second step of calculating nonlinear deviation amounts of the coordinate positions of the N sample areas on the basis of the coordinate positions measured in the first step;
    a third step of calculating nonlinear deviation amounts of coordinate positions of (N−1) sample areas, obtained by rejecting one sample area from the N sample areas, on the basis of the coordinate positions measured in the first step; and
    a fourth step of rejecting said one sample area from the plural sample areas for calculating coordinate positions, on the coordinate system, of each of plural sample areas when the variation of said (N−1) nonlinear deviation amounts calculated in the third step is smaller than the variation of said (N) nonlinear deviation amounts calculated in the second step.

2. A method of aligning each of a plurality of areas on a substrate to a predetermined position in a coordinate system for defining a moving position of said substrate, comprising:
    a first step of measuring coordinate positions, on the coordinate system, of N (N is an integer not less than 2) sample areas selected from the plurality of areas;
    a second step of calculating nonlinear deviation amounts of the coordinate positions of the N sample areas on the basis of the coordinate positions measured in the first step;
    a third step of calculating nonlinear deviation amounts of coordinate positions of (N−1) sample areas obtained by rejecting one sample area from the N sample areas based on the coordinate positions measured in the first step; and
    a fourth step of selecting said one sample area as a sample area for calculating coordinate positions, on the coordinate system, of each of plural sample areas when the variation of the (N−1) nonlinear deviation amounts calculated in the third step is not less than the variation of the N nonlinear deviation amounts calculated in the second step.

3. A method according to claim 1, wherein in the fourth step, when the variation of said (N−1) nonlinear deviation amounts calculated in the third step is smaller than the variation of said (N) nonlinear deviation amounts calculated in the second step, said (N−1) sample areas are selected as sample areas for calculation, and when the variation of the (N−1) nonlinear deviation amounts calculated in the third step is not less than the variation of the N nonlinear deviation amounts calculated in the second step, said (N) sample areas are selected as sample areas for calculation.

4. A method according to claim 3, further comprising:
    a fifth step of calculating coordinate positions, on the coordinate system, of said selected sample areas for calculation by executing statistical processing of the coordinate positions, measured in the first step, said substrate being moved according to the calculated coordinate position thereby each of said plural areas is aligned to said predetermined position sequentially.

5. A method according to claim 4, further comprising:
    a sixth steps of moving said substrate according to said calculated coordinate positions by step-and repeat method or step-and-scanning method so that each of said plural areas is exposed against a pattern image of a mask.

6. A method according to claim 3, wherein coordinate positions, on the coordinate system, of one of the plurality of areas are calculated by executing statistical processing of the coordinate positions measured in the first step in consideration of weight corresponding to the distance between each of the selected sample areas for calculation and said one of the plurality of areas.

7. A method according to claim 1, wherein in the fourth step when the variation of the (N−1) nonlinear deviation amounts calculated in the third step is smaller than the variation of the N nonlinear deviation amounts calculated in the second step, the N sample areas in the second step are replaced by the (N−1) sample areas used in the third step, and the second to fourth steps are repeated.

8. A method according to claim 7, wherein the second to fourth steps are repeated within a range in which the number of sample areas other than sample areas rejected in the fourth step is not less than a predetermined tolerance value.

9. A method according to claim 1, wherein in the third step, N variations of the nonlinear deviation amounts are obtained with respect to the N−1 sample areas, selecting one sample area to be rejected from the N sample areas in each of the N sample areas and in the fourth step, one sample area with which the variation of (N−1) nonlinear deviation amounts in the N sample areas is minimum and is smaller than that of the N nonlinear deviation amounts is rejected from sample areas for calculation.

10. A method according to claim 9, wherein in the fourth step, the obtained N variations are not respectively less than those the variation of the N nonlinear deviation amounts, the N sample areas are selected as sample areas.

11. A method according to claim 9, wherein when, in the fourth step, at least one of the N variations is smaller than the variation of the N nonlinear deviation amounts, the N sample areas of the second step are replaced with the N−1 sample areas of the third step and the second to fourth steps are repeated.

12. A method according to claim 1, wherein said second step includes the sub-steps of:
    calculating the coordinate position, on said coordinate system, of each of the N sample areas by executing statistical processing of the measured coordinate positions of the N−1 sample areas; and
    obtaining a deflection amount between the measured coordinate position and the calculated coordinate position in each of the N sample areas, as the nonlinear deviation amount.

13. A method according to claim 1, wherein said third step includes the sub-steps of:
    calculating the coordinate position, on said coordinate system, of each of the N−1 sample areas by executing statistical processing of the measured coordinate positions of the N−1 sample areas; and
    obtaining a deflection amount between the measured coordinate position and the calculated coordinate position in each of the N−1 sample areas, as the nonlinear deviation amount.

14. A method of aligning each of a plurality of areas on a substrate to a predetermined position in a coordinate system for defining a moving position of the substrate, comprising:

a first step of measuring coordinate positions, on the coordinate system, of N (N is an integer not less than 2) sample areas selected from the plurality of areas;

a second step of calculating nonlinear deviation amount of the coordinate positions of the (N−1) sample areas obtained by sequentially rejecting an i-th (i is an integer from 1 to N) sample area from the N sample areas on the basis of the coordinate positions measured in the first step thereby to obtain N variations;

a third step of determining sample areas for calculation of the coordinate position, on said coordinate system, of each of the plural areas based on the N variations.

15. A method according to claim 14, wherein in the third step, one sample area, of the N sample areas, in which said variation is minimum, is rejected from the sample areas for calculation.

16. A method according to claim 14, further comprising:
a fourth step of calculating coordinate positions, on the coordinate system, of said selected sample areas for calculation by executing statistical processing of the coordinate positions, measured in the first step, said substrate being moved according to the calculated coordinate position thereby each of said plural areas is aligned to said predetermined position sequentially.

17. A method according to claim 16, further comprising:
a fifth steps of moving said substrate according to said determined coordinate positions by step-and repeat method or step-and-scanning method so that each of said plural areas is exposed against a pattern image of a mask.

18. A method according to claim 14, wherein said second step includes the sub-steps of:
calculating the coordinate position, on said coordinate system, of each of the N−1 sample areas by executing statistical processing of the measured coordinate positions of the N−1 sample areas; and
obtaining a deflection amount between the measured coordinate position and the calculated coordinate position in each of the N−1 sample areas, as the nonlinear deviation amount.

19. A method of aligning each of a plurality of areas on a substrate to a predetermined position in a coordinate system for defining a moving position of the substrate, comprising:
a first step of measuring coordinate positions, on the coordinate system, of N (N is an integer not less than 2) sample areas selected from the plurality of areas;
a second step of calculating the variation of nonlinear deviation amounts of the coordinate positions of the N sample areas and the variation of nonlinear deviation amounts of N−1 sample areas in which one sample area is rejected from the N sample area on the basis of the coordinate positions measured in the first step;
a third step of rejecting the one sample area from the sample areas for calculating the coordinate positions, on the coordinate system, of the plural areas when the variation of the nonlinear deviation amounts if the N−1sample areas is smaller than that of the N sample areas.

20. A method of aligning each of a plurality of areas on a substrate to a predetermined position in a coordinate system for defining a moving position of the substrate, comprising:
a first step of measuring coordinate positions, on the coordinate system, of N (N is an integer not less than 2) sample areas selected from the plurality of areas;

a second step of calculating the variation of nonlinear deviation amounts of the coordinate positions of the N sample areas on the basis of the coordinate positions measured in the first step;

a third step of calculating the variation of nonlinear deviation amounts of N−1 sample areas in which one sample area is rejected from the N sample area on the basis of the coordinate positions measured in the first step;

a fourth step of rejecting the one sample area from the sample areas for calculating the coordinate positions, on the coordinate system, of the plural areas when the variation of the nonlinear deviation amounts if the N−1 sample areas is smaller than that of the N sample areas; and a fifth step of, when the variation of the N−1 nonlinear deviation amounts is out of a predetermined tolerance region, rejecting the predetermined sample areas from the N sample areas and repeating from the second step to the fourth step.

21. A method according to claim 20, further comprising:
a sixth step of calculating coordinate positions, on the coordinate system, of said selected sample areas for calculation by executing statistical processing of the coordinate positions of the sample areas except for the sample areas rejected in the fourth step;
said substrate being moved according to the calculated coordinate position thereby each of said plural areas is aligned to said predetermined position sequentially.

22. A method according to claim 21, further comprising:
a seventh step of moving said substrate according to said calculated coordinate positions by step-and repeat method or step-and-scanning method so that each of said plural areas is exposed against a pattern image of a mask.

23. A method according to claim 20, wherein in the fifth step when the number of the sample areas except for the sample areas rejected in the fourth step is over a predetermined tolerance number, the second to fourth steps are repeated.

24. A method according to claim 20, wherein the tolerance region of the fifth step depends on the variation in measuring the coordinate positions, on the coordinate system, of the sample areas.

25. A method according to claim 20, wherein in the third step, N variations of the nonlinear deviation amounts are obtained with respect to the N−1 sample areas, selecting one sample area to be rejected from the N sample areas in each of the N sample areas and in the fourth step, one sample area with which the variation of (N−1) nonlinear deviation amounts in the N sample areas is minimum and is smaller than that of the N nonlinear deviation amounts is rejected from sample areas for calculation.

26. A method of aligning each of a plurality of areas on a substrate to a predetermined position in a predetermined coordinate system, comprising:
a first step of measuring coordinate positions on said coordinate system of each of N sample areas out of the plurality of areas, N being an integer not less than 2;
a second step of calculating nonlinear deviation amounts of the coordinate positions of each of said N sample areas on the basis of said measured coordinate positions;
a third step of calculating nonlinear deviation amounts of coordinate positions of (N−1) sample areas, obtained by rejecting one sample area from said N sample areas, on the basis of said measured coordinate positions; and a fourth step of comparing the variation of said (N−1) nonlinear deviation amounts with the variation of said N nonlinear deviation amounts, and judging whether the coordinate positions of said one sample area should be rejected from the calculation of the coordinate positions, on said coordinate system, of each of said plurality of areas on said substrate, on the basis of result of the comparison.

27. A method according to claim 14, wherein in said third step, said N sample areas are selected as said sample areas calculation when each of said N variations is not less than the variation of N nonlinear deviation amounts of coordinate positions of said N sample areas.

28. A method according to claim 14, wherein in said third step, one sample area is rejected from said sample areas for calculation, said one sample area having the variation thereof which is not more than the variation of N nonlinear deviation amount of coordinate positions of said N sample areas.

29. A method according to claim 28, wherein said second and third steps are repeated until in said third step, J (J is an integer from 1 to N−4) sample areas are rejected from said N sample areas and thereafter N−J variations obtain in said second step are not less than the variations of nonlinear deviation amounts of (N−J+1) coordinate positions.

30. A method according to claim 15, wherein said second and third steps are repeated until the variations obtained in said second are predetermined allowable ranges respectively.

31. A method according to claim 15, wherein said N sample areas consists of said plurality of areas on said substrate.

32. A method of aligning each of a plurality of areas on a substrate to a predetermined position in a coordinate system, comprising the steps of:

measuring coordinate positions on the coordinate system of each of N sample areas among the plurality of areas; and determining nonlinear deviation amounts of coordinate positions of (N−1) sample areas, obtained by rejecting one sample area from the N sample areas, based on the measured coordinate positions;

wherein at least three sample areas for calculation of coordinate positions of the plurality of areas are determined based on the (N−1) nonlinear deviation amounts.

33. A method according to claim 32, further comprising the step of:

moving said substrate based on said calculation of coordinate positions to expose each of said plurality of areas with a pattern.

34. A method of aligning each of a plurality of areas on a substrate to a predetermined position in a coordinate system, comprising the steps of:

measuring coordinate positions on the coordinate system of each of N sample areas among the plurality of areas; and determining a standard deviation of nonlinear deviation amounts of (N−1) sample areas, obtained by rejecting one sample area from the N sample areas, based on the measured coordinate positions, wherein at least three sample areas for calculation of coordinate positions of the plurality of areas are determined based on the determined standard deviations.

* * * * *